United States Patent
Carpenter et al.

(10) Patent No.: US 9,322,855 B2
(45) Date of Patent: *Apr. 26, 2016

(54) NON-CONTACT CURRENT AND VOLTAGE SENSOR HAVING DETACHABLE HOUSING INCORPORATING MULTIPLE FERRITE CYLINDER PORTIONS

(71) Applicant: INTERNATIONAL BUSINESS MACHINES CORPORATION, Armonk, NY (US)

(72) Inventors: Gary D. Carpenter, Austin, TX (US); Wael El-Essawy, Austin, TX (US); Alexandre Peixoto Ferreira, Austin, TX (US); Thomas Walter Keller, Austin, TX (US); Juan C. Rubio, Austin, TX (US); Michael A. Schappert, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 23 days.

This patent is subject to a terminal disclaimer.

(21) Appl. No.: 14/319,389

(22) Filed: Jun. 30, 2014

(65) Prior Publication Data

US 2014/0312895 A1    Oct. 23, 2014

Related U.S. Application Data

(63) Continuation of application No. 13/451,524, filed on Apr. 19, 2012, which is a continuation of application No. 13/024,181, filed on Feb. 9, 2011, now Pat. No. 8,680,845.

(51) Int. Cl.
*G01R 33/02* (2006.01)
*G01R 21/06* (2006.01)
(Continued)

(52) U.S. Cl.
CPC *G01R 21/06* (2013.01); *G01R 1/22* (2013.01); *G01R 15/142* (2013.01); *G01R 33/02* (2013.01); *G01R 33/072* (2013.01)

(58) Field of Classification Search
CPC ...... G01R 21/06; G01R 33/02; G01R 15/142; G01R 1/22; G01R 33/072
USPC ..................................... 324/117 H, 116–127
See application file for complete search history.

(56) References Cited

U.S. PATENT DOCUMENTS

| 4,005,380 A | 1/1977 | Heilmann et al. |
| 4,266,189 A | 5/1981 | Karlin et al. |

(Continued)

FOREIGN PATENT DOCUMENTS

| CN | 101329370 A | 12/2008 |
| CN | 201654106 U | 11/2010 |

(Continued)

OTHER PUBLICATIONS

Notice of Allowance in U.S. Appl. No. 13/682,112 mailed on Feb. 19, 2015, 11 pages (pp. 1-11 in pdf).

(Continued)

*Primary Examiner* — Jay Patidar
(74) *Attorney, Agent, or Firm* — Mitch Harris, Atty at Law, LLC; Andrew M. Harris; William J. Stock

(57) ABSTRACT

A detachable current and voltage sensor provides an isolated and convenient device to measure current passing through a conductor such as an AC branch circuit wire, as well as providing an indication of an electrostatic potential on the wire, which can be used to indicate the phase of the voltage on the wire, and optionally a magnitude of the voltage. The device includes a housing formed from two portions that mechanically close around the wire and that contain the current and voltage sensors. The current sensor is a ferrite cylinder formed from at least three portions that form the cylinder when the sensor is closed around the wire with a hall effect sensor disposed in a gap between two of the ferrite portions along the circumference to measure current. A capacitive plate or wire is disposed adjacent to, or within, the ferrite cylinder to provide the indication of the voltage.

6 Claims, 5 Drawing Sheets

(51) Int. Cl.
  *G01R 1/22* (2006.01)
  *G01R 15/14* (2006.01)
  *G01R 33/07* (2006.01)

(56) References Cited

U.S. PATENT DOCUMENTS

| | | | |
|---|---|---|---|
| 4,378,525 | A | 3/1983 | Burdick |
| 4,558,276 | A | 12/1985 | Comeau et al. |
| 5,473,244 | A | 12/1995 | Libove et al. |
| 5,610,512 | A | 3/1997 | Selcuk |
| 5,867,020 | A | 2/1999 | Moore et al. |
| 6,008,634 | A | 12/1999 | Murofushi et al. |
| 6,414,474 | B1 | 7/2002 | Gohara et al. |
| 6,522,509 | B1 | 2/2003 | Engel et al. |
| 6,654,219 | B1 | 11/2003 | Romano et al. |
| 6,661,239 | B1 | 12/2003 | Ozick |
| 6,703,842 | B2 | 3/2004 | Itimura et al. |
| 6,708,126 | B2 | 3/2004 | Culler et al. |
| 6,825,649 | B2 | 11/2004 | Nakano |
| 6,940,291 | B1 | 9/2005 | Ozick |
| 7,068,045 | B2 | 6/2006 | Zuercher et al. |
| 7,098,644 | B1 | 8/2006 | Denison |
| 7,148,675 | B2 | 12/2006 | Itoh |
| 7,227,348 | B2 | 6/2007 | Sorensen |
| 7,230,413 | B2 | 6/2007 | Zhang et al. |
| 7,265,533 | B2 | 9/2007 | Lightbody et al. |
| 7,315,161 | B2 | 1/2008 | Zribi et al. |
| 7,330,022 | B2 | 2/2008 | Bowman et al. |
| 7,474,088 | B2 | 1/2009 | Bowman et al. |
| 7,493,222 | B2 | 2/2009 | Bruno |
| 7,546,214 | B2 | 6/2009 | Rivers, Jr. et al. |
| 7,622,912 | B1 | 11/2009 | Adams et al. |
| 7,714,594 | B2 | 5/2010 | Ibuki et al. |
| 7,719,257 | B2 | 5/2010 | Robarge et al. |
| 7,719,258 | B2 | 5/2010 | Chen et al. |
| 7,847,543 | B2 | 12/2010 | Grno |
| 7,936,164 | B2 | 5/2011 | Doogue et al. |
| 7,990,133 | B2 | 8/2011 | Dockweiler |
| 8,680,845 | B2 | 3/2014 | Carpenter et al. |
| 2004/0227503 | A1 | 11/2004 | Bowman |
| 2004/0257061 | A1 | 12/2004 | George de Buda |
| 2005/0156587 | A1 | 7/2005 | Yakymyshyn et al. |
| 2006/0087777 | A1 | 4/2006 | Bruno |
| 2007/0058304 | A1 | 3/2007 | Parker et al. |
| 2008/0077336 | A1 | 3/2008 | Fernandes |
| 2008/0079437 | A1 | 4/2008 | Robarge et al. |
| 2009/0105973 | A1 | 4/2009 | Choi et al. |
| 2009/0289694 | A1 | 11/2009 | Rieger et al. |
| 2010/0001715 | A1 | 1/2010 | Doogue et al. |
| 2010/0231198 | A1 | 9/2010 | Bose et al. |
| 2010/0264944 | A1 | 10/2010 | Rupert |
| 2010/0271037 | A1 | 10/2010 | Blakely |
| 2010/0283487 | A1 | 11/2010 | Juds et al. |
| 2011/0084688 | A1 | 4/2011 | Sorensen |
| 2012/0078545 | A1 | 3/2012 | Hong et al. |
| 2012/0078680 | A1 | 3/2012 | Tharp |
| 2012/0200285 | A1 | 8/2012 | Carpenter et al. |
| 2012/0200293 | A1 | 8/2012 | Carpenter et al. |
| 2012/0203481 | A1 | 8/2012 | Carpenter et al. |
| 2012/0319674 | A1 | 12/2012 | El-Essawy et al. |
| 2012/0319675 | A1 | 12/2012 | El-Essawy et al. |
| 2012/0319676 | A1 | 12/2012 | El-Essawy et al. |
| 2013/0076343 | A1 | 3/2013 | Carpenter et al. |
| 2013/0099775 | A1 | 4/2013 | Mitsuya |
| 2013/0241529 | A1 | 9/2013 | El-Essawy et al. |
| 2014/0062459 | A1 | 3/2014 | El-Essawy et al. |
| 2014/0167787 | A1 | 6/2014 | Sanchez et al. |

FOREIGN PATENT DOCUMENTS

| | | |
|---|---|---|
| JP | 06174753 A | 6/1994 |
| JP | H09281146 A | 10/1997 |
| WO | WO2009042414 A2 | 4/2009 |

OTHER PUBLICATIONS

U.S. Appl. No. 13/752,668, filed Jan. 29, 2013, El-Essawy, et al.
Clarke, John, "Compact 0-80A Automotive Ammeter", Silicon Chip, issue 165, pp. 1-12, downloaded from www.siliconchip.com.au/cms/A_03551/article.html Nov. 4, 2010, published Jun. 30, 2002, 12 pages (pp. 1-12 in pdf).
Clarke, John, "Current Clamp Meter Adapter for DMMs", Silicon Chip, issue 180, published Sep. 12, 2003, 9 pages (pp. 1-9 in pdf).
Ziegler, et al., "Current Sensing Techniques: A Review", IEEE Sensors Journal, Apr. 2009, pp. 354-376 vol. 9, No. 4. Piscataway, NJ.
McKenzie, et al. "Non-contact Voltage Measurement using Electronically Varying Capacitance", Electronics Letters, Feb. 4, 2010, 2 pages (pp. 1-2 in pdf), vol. 46, No. 3, UK.
"AC Current sensor with Interface" downloaded from: http://www.electronicspoint.com/ac-current-sensor-interface-t221239.html on Jun. 10, 2011, 4 pages (pp. 1-4 in pdf).
"Smart Current Signature Sensor" downloaded from http://technology.ksc.nasa.gov/successes/SS-Smart-Current-Signal-Snsr.htm on Jun. 10, 2011, 2 pages (pp. I-2 in pdf).
Dwyer, Daniel, "A Self-Calibrating Miniature Hall Effect Solution to Gear Tooth Speed Sensing", downloaded from: //saba.kntu.ac.ir/eecd/ecourses/instrumentation/projects/reports/speed/toothed%20rotor/toothrotor_files/main.htm on May 25, 2011, 10 pages (pp. 1-10 in pdf).
Valuetesters.com on-line catalog: "non-contact voltage probes", downloaded from http://valuetesters.com/Voltage-Probe-Non-contact.php on May 25, 2011, 5 pages (pp. 1-5 in pdf).
Office Action in U.S. Appl. No. 13/024,181, mailed on Aug. 1, 2013, 11 pages (pp. 1-11 in pdf).
Notice of Allowance in U.S. Appl. No. 13/024,181, mailed on Oct. 28, 2013, 7 pages (pp. 1-7 in pdf).
Office Action in U.S. Appl. No. 13/451,524 mailed on Aug. 11, 2014, 18 pages (pp. 1-18 in pdf).
Office Action in U.S. Appl. No. 13/682,112 mailed on Nov. 3, 2014, 44 pages (pp. 1-44 in pdf).
Office Action in U.S. Appl. No. 13/451,524 mailed on Jun. 9, 2015, 18 pages (pp. 1-18 in pdf).

NON-CONTACT CURRENT AND VOLTAGE SENSOR HAVING DETACHABLE HOUSING INCORPORATING MULTIPLE FERRITE CYLINDER PORTIONS

The present Application is a Continuation of U.S. patent application Ser. No. 13/451,524, filed on Apr. 19, 2012, which is a Continuation of U.S. patent application Ser. No. 13/024, 181, filed on Feb. 9, 2011 and issued as U.S. Pat. No. 8,680, 845 on Mar. 25, 2014, and claims priority thereto under 35 U.S.C. 120. The disclosure of the above-referenced Parent U.S. Patent Application is incorporated herein by reference.

This invention was made with government support under DE-EE0002897 awarded by the Department of Energy. The government has certain rights to this invention.

BACKGROUND OF THE INVENTION

1. Field of the Invention

The present invention is related to sensors providing input to power measurement systems, and more specifically to a non-contact sensor that includes an electrostatic voltage sensor and an electromagnetic current sensor that can be used to detect the voltage and current at a wire of a power distribution system.

2. Description of Related Art

A need to measure power consumption in AC line powered systems is increasing due to a focus on energy efficiency for both commercial and residential locations. In order to provide accurate measurements, the characteristics of the load must be taken into account along with the current drawn by the load.

In order to determine current delivered to loads in an AC power distribution system, and in particular in installations already in place, current sensors are needed that provide for easy coupling to the high voltage wiring used to supply the loads, and proper isolation is needed between the power distribution circuits/loads and the measurement circuitry.

Therefore, it would be desirable to provide a sensor that can provide isolated current draw information and permit load characteristics to be taken into account using outputs of a single sensor in an AC power distribution circuit.

BRIEF SUMMARY OF THE INVENTION

The invention is embodied in a current and voltage sensing device and its method of operation. The current sensing device includes a current sensor and a voltage sensor both integrated in a housing that can be detachably coupled to a wire and provides outputs indicative of the current passing through the wire, as well as an electric potential on the wire.

The housing may be a clamshell containing portions of a current sensor formed from a ferrite cylinder, which when closed around the wire, form either a complete ferrite cylinder, or one with a gap along the circumference. A semiconductor magnetic field sensor may be included in the gap and used to measure the current passing through the wire, or a winding may be provided around the ferrite cylinder along its axis. The voltage sensor may be a separate cylindrical plate, another wire or other suitable conductor either offset from the current sensor along the length of the wire, or may be a foil located inside of the ferrite sensor or a film deposited on an inside surface of the ferrite.

The foregoing and other objectives, features, and advantages of the invention will be apparent from the following, more particular, description of the preferred embodiment of the invention, as illustrated in the accompanying drawings.

BRIEF DESCRIPTION OF THE SEVERAL VIEWS OF THE DRAWING

The novel features believed characteristic of the invention are set forth in the appended claims. The invention itself, however, as well as a preferred mode of use, further objectives, and advantages thereof, will best be understood by reference to the following detailed description of the invention when read in conjunction with the accompanying Figures, wherein like reference numerals indicate like components, and:

DETAILED DESCRIPTION OF THE INVENTION

The present invention encompasses sensors for current and voltage sensing features for providing input to power measurement systems. For example, the present invention can provide input to power monitoring equipment in computer server rooms, in which branch circuits distribute power to various electronic chassis power supplies, and in which it is beneficial to provide power usage information for the various branch circuits to power monitoring and/or system control utilities within a computer operating environment. Other applications include power monitoring for commercial and/or residential energy management.

Figure 1A:
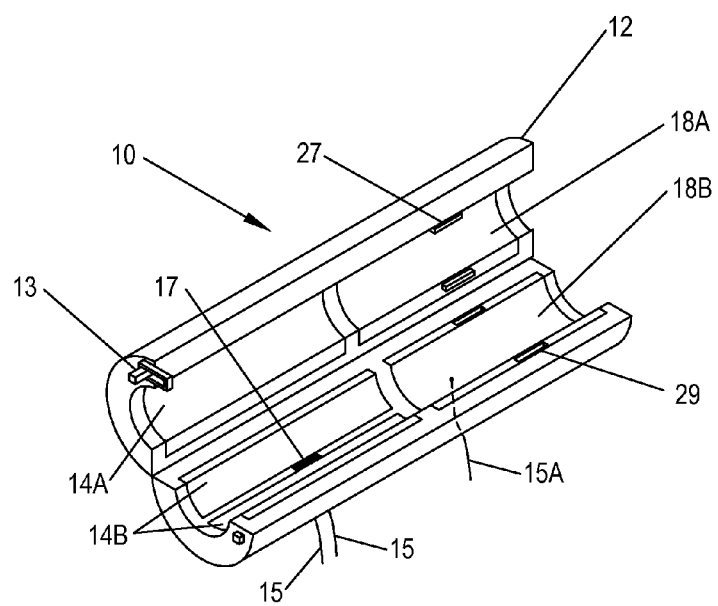
FIG. 1A and FIG. 1B are isometric views and FIG. 1C is a cross-section view of a sensor according to an embodiment of the present invention.
Figure 1B:
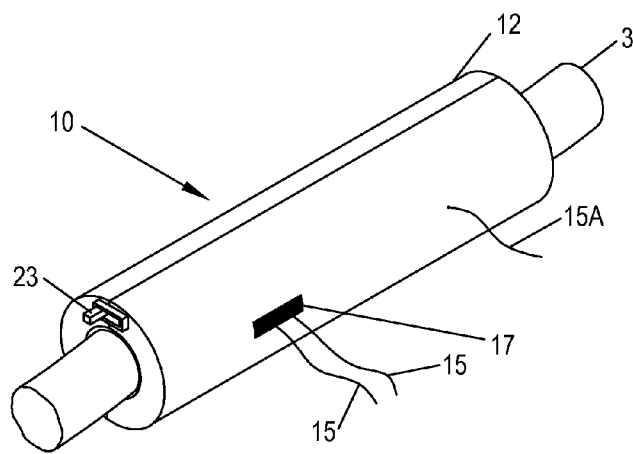
Figure 1C:
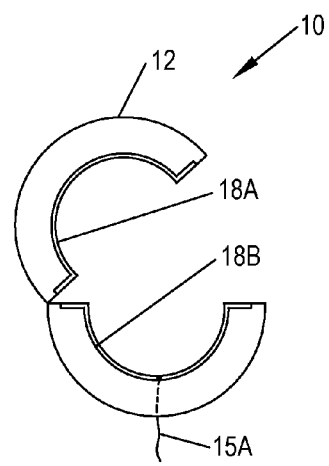

Referring now to FIGS. 1A-1C, a sensor 10 in accordance with an embodiment of the present invention is shown. A plastic sensor body 12 encloses a current sensor and a voltage sensor, that provide information about a magnitude and phase of a current passing through a wire 3 around which sensor body is detachably secured as shown in FIG. 1B. A latch 13 secures a top portion and a bottom portion of sensor body 12 together, along with a hinge formed on sensor body 12 at an opposite side from latch 13. A current sensing portion of sensor 10 is formed by three ferrite pieces 14A, 14B that form a ferrite cylinder around wire 3, when sensor body 12 is closed. Top ferrite piece 14A forms a half-cylinder, while ferrite pieces 14B define a gap between ferrite pieces 14B and in the circumference of the ferrite cylinder, in which current sensing element 17, which is generally a semiconductor magnetic field sensor, such as a Hall effect sensor, is disposed. Current sensing element 17 is shown as having interface wires 15 extending from its body, but other types of terminals may be used as an alternative manner of providing connections to current sensing element 17. An aperture is formed through sensor body 12 to receive current sensing element 17. A voltage sensor is formed by metal plates 18A, 18B, which provide capacitive coupling to branch circuit wire 3 and provide an output via interface wire 15A, which may also alternatively be replaced with a terminal or other suitable electrical connector. The voltage sensor provides an AC waveform that is at least indicative of the phase of the voltage on wire 3 and may be calibrated to provide an indication of the magnitude of the voltage if needed. Electrical connection to metal plate 18B is provided by interface wire 15A and electrical connection to metal plate 18A is provided by contact between metal plates 18A and 18B when sensor body 12 is latched closed. Metal plate 18A includes a contact 27 and metal plate 18B includes a mating recess 29 to improve electrical contact between metal plates 18A and 18B, so that connection of one of metal plates 18A and 18B to the measurement system is needed to provide voltage sensing. Contacts 27 and mating recesses 29 are optional and may be omitted in other embodiments of the invention, and electrical connection may be provided only by contact between metal places 18A and 18B, or alternatively by other suitable connection improvement techniques. FIG. 1C illustrates such an embodiment so that metal plates 18A and 18B making contact when sensor body 12 is closed, and shows the connection of interface wire 15A to metal plate 18B.

Figure 2A:
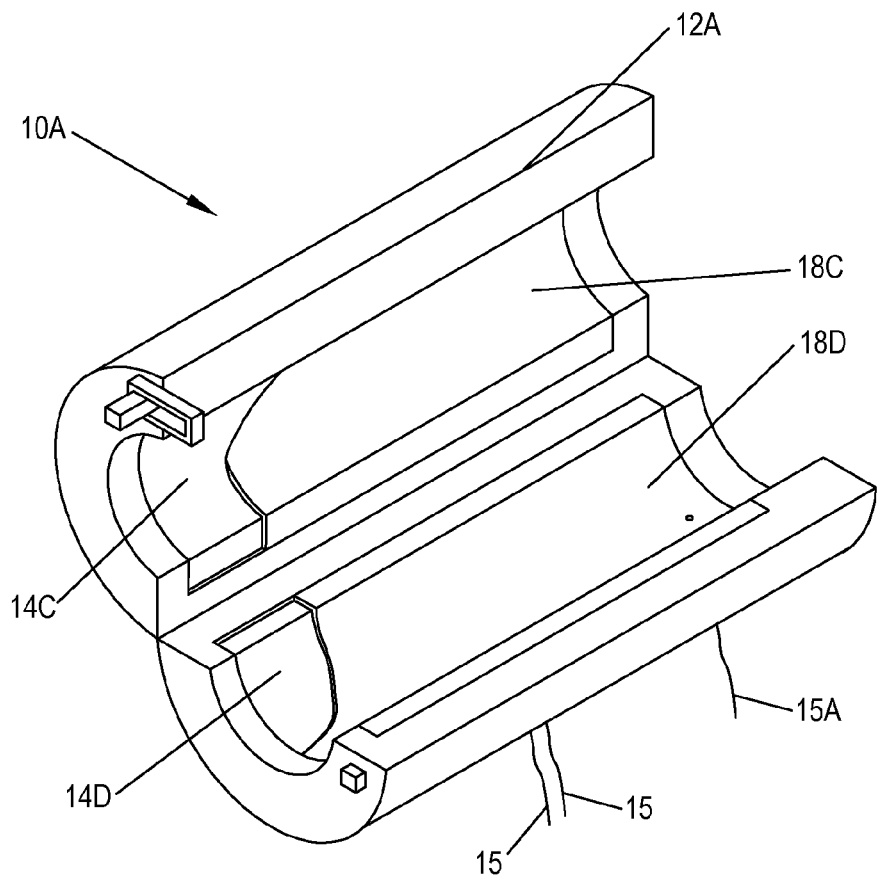
FIG. 2A is an isometric view and FIG. 2B is a cross-section view of a sensor according to another embodiment of the present invention.
Figure 2B:
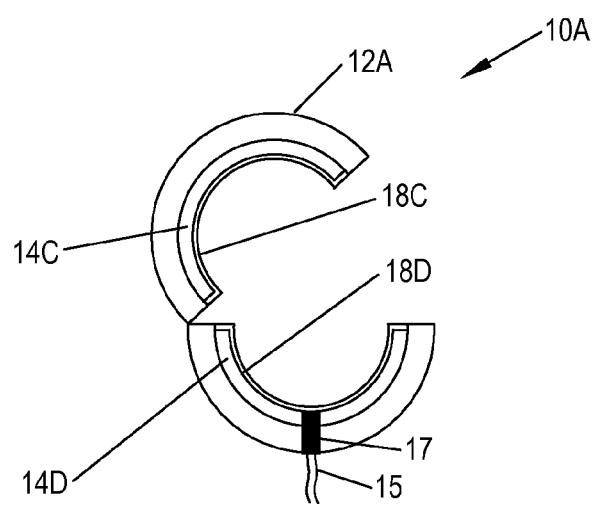

Referring now to FIGS. 2A and 2B, a sensor 10A in accordance with another embodiment of the invention is shown. Sensor 10A is similar to sensor 10 of FIGS. 1A-1C, so only differences between them will be described below. Rather than including current sensing and voltage sensing elements that are laterally displaced along the axis of the cylinder formed by sensor body 12 as in sensor 10 shown in FIG. 1A, in sensor 10A, the voltage sensor and current sensors are concentrically arranged, reducing the length of sensor 10A over that of sensor 10, while providing similar capacitive area for the voltage sensing and ferrite volume for the current sensing. Therefore, sensor 10A includes metal plates 18C and 18D having shapes differing from that of than metal plates 18A-18B in sensor 10, and ferrite pieces 14C-14D differ from ferrite pieces 14A-14B of sensor 10, as well. Metal plates 18C and 18D, provide metal layers within sensor 10A that may be inserts mechanically secured by sensor shell 12A, or metal films bonded to or deposited on the interior surfaces of ferrite pieces 14C-14D. In the illustrated example, metal plates 18C and 18D include jogs at their ends in order to provide electrical contact between them and ferrite pieces 14C-14D do not make contact as in sensor 10 of FIGS. 1A-1C, and therefore the total circumferential gap in the ferrite cylinder is increased slightly. However, in alternative embodiments, the jogs may be omitted from metal plates 18C and 18D and alternative electrical connection techniques may be employed, by including a second interface wire 15A bonded to metal plate 18C and/or additional interface metal along the edges of sensor body 12 outside of the ends of ferrite pieces 14C-14D, which can then be extended to make contact as in sensor 10 of FIGS. 1A-1C.

Figure 3A:
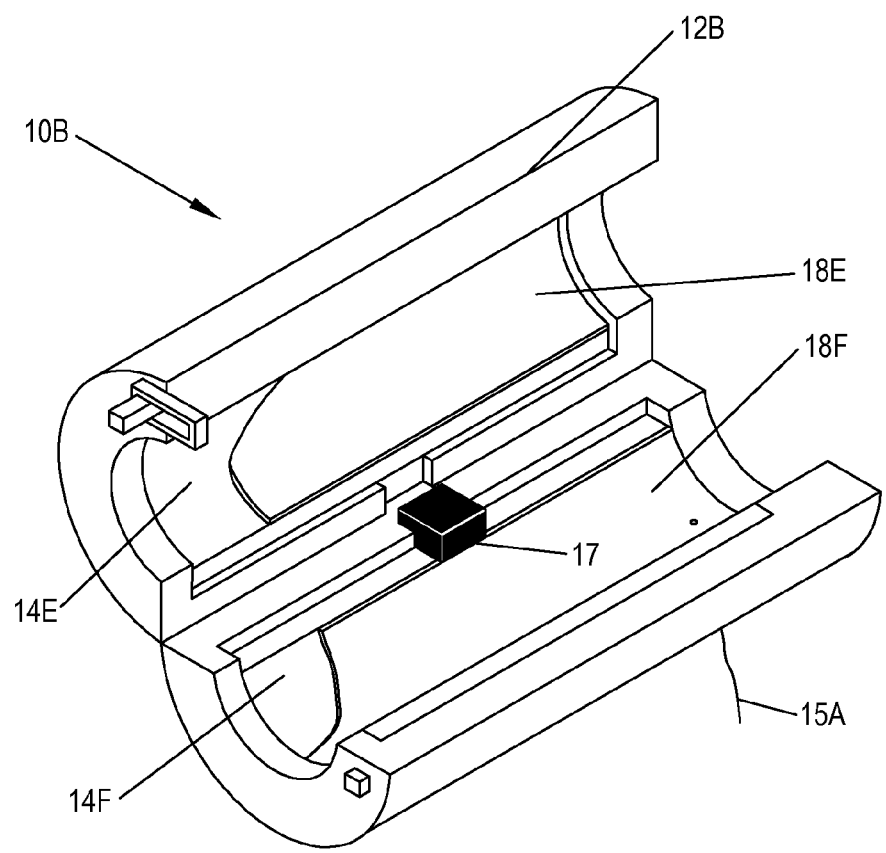
FIG. 3A is an isometric view and FIG. 3B is a cross-section view of a sensor according to yet another embodiment of the present invention.
Figure 3B:
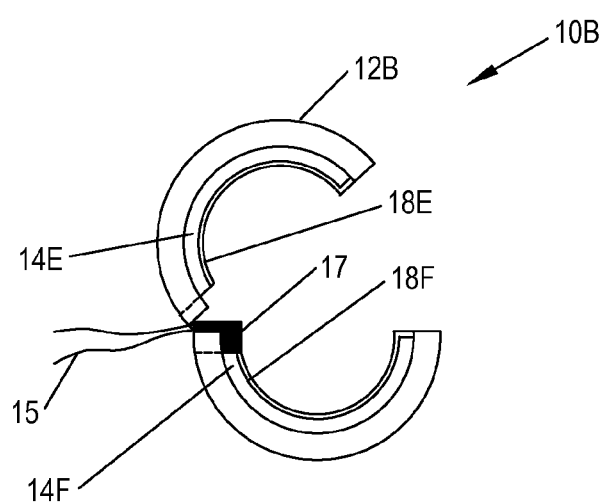

Referring now to FIGS. 3A and 3B, a sensor 10B in accordance with yet another embodiment of the invention is shown. Sensor 10B is similar to sensor 10A of FIGS. 2A-2B, so only differences between them will be described below. Rather than locating current sensing element 17 in a gap between two ferrite pieces 14B as in sensor 10A of FIGS. 2A-2B, in sensor 10B, current sensing element is located between two ferrite pieces 14E and 14F that extend around the entire circumference of sensor 10B, excepting the thickness of current sensing element 17, and therefore only one circumferential gap is formed provided that ferrite pieces 14E and 14F are in contact when sensor 10B is closed at the area opposite the hinge in sensor body 12B. Recesses are formed in sensor body 12B to accept current sensing element 17, which may be bonded to, or molded within sensor body 12B, as may also be performed for any of the integration of current sensing element 17 in the present application. Metal plates 18E and 18F are shown as having jogs only opposite of the hinged portion of sensor body 12B, to provide for ferrite pieces 14E and 14F extending all of the circumferential distance to the body of current sensing element 17 and since ferrite pieces 14E and 14F are not in contact along the hinged portion of sensor body 12B. However, in accordance with an alternative embodiment of the invention, metal plates 18E and 18F may include features within the gap formed between ferrite pieces 14E and 14F along the hinged portion of sensor body 12B to provide additional electrical contact between metal plates 18E and 18F. Further, in accordance with another embodiment of the invention, if sensor body 12B is made of a sufficiently flexible material and/or the hinged portion of sensor body 12B is sufficiently elastic, ferrite pieces 14E, 14F may extend all of the way to the inside faces of sensor body 12B on both sides of sensor body 12B. In such an embodiment, sensing element 17 is inserted in either the hinged side or the latching side of sensor body 12B between the faces of ferrite pieces 14E, 14F to form the gap and make contact with ferrite pieces 14E, 14F.

Figure 4A:
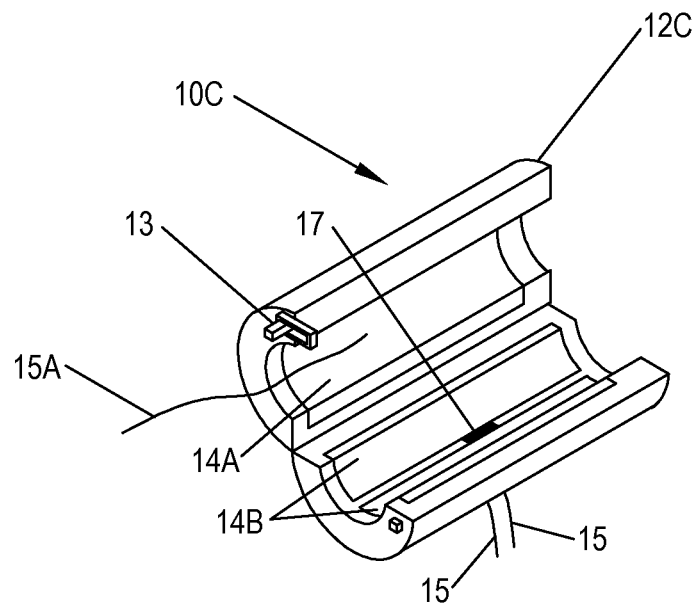
FIG. 4A is an isometric view and FIG. 4B is a cross-section view of a sensor according to still another embodiment of the present invention.
Figure 4B:
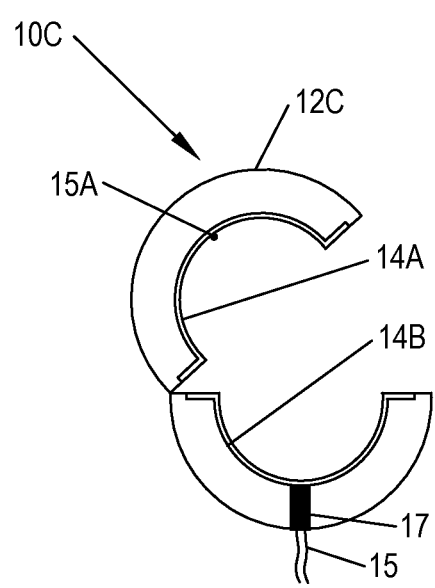

Referring now to FIGS. 4A and 4B, a sensor 10C in accordance with yet another embodiment of the invention is shown. Sensor 10C is similar to sensor 10 of FIGS. 1A-1C, so only differences between them will be described below. Rather than including metal plates 18A and 18B and the portion of sensor body 12 that extends to provide the voltage sensing portion of sensor 10 in FIG. 1A, interface wire 15A extends within the cylindrical cavity formed by sensor body 12C and ferrite pieces 14A-14B to provide voltage sensing, which can provide sufficient coupling to perform voltage sensing, in particular when only the phase of the voltage on wire 3 is to be measured.

Figure 5:
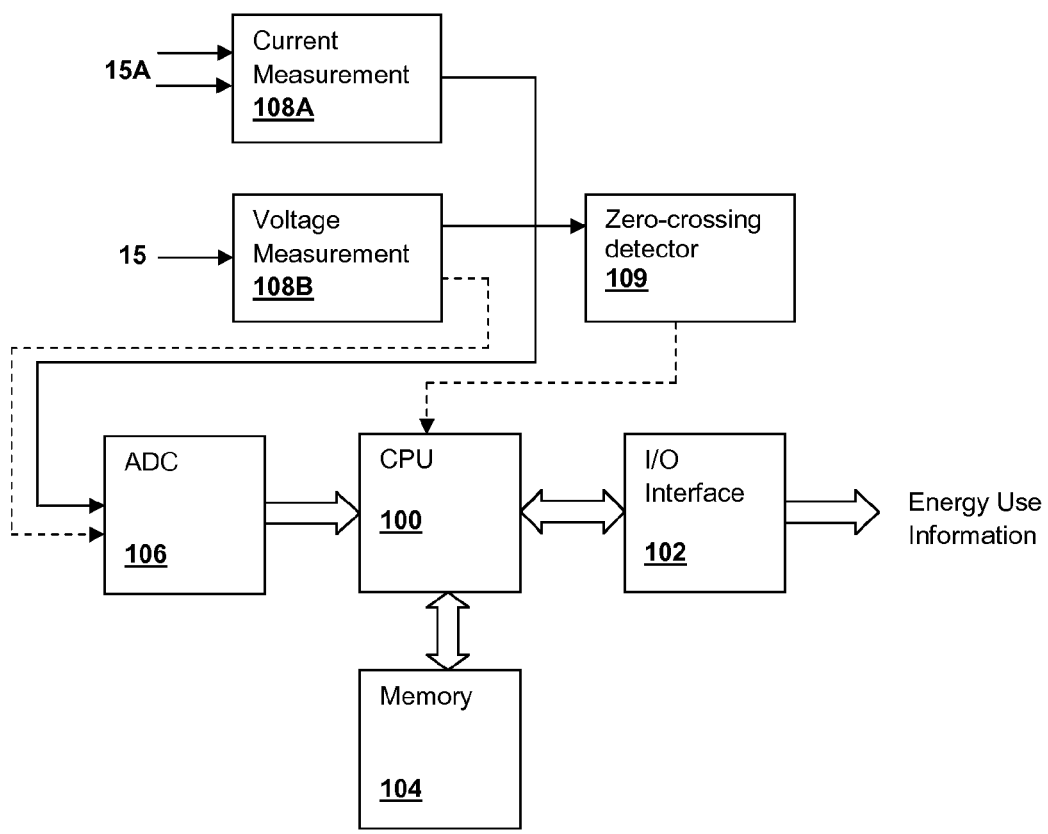
FIG. 5 is an electrical block diagram illustrating circuits for receiving inputs from sensors according to embodiments of the present invention.

Referring now to FIG. 5, a circuit for receiving input from the current/voltage sensors of FIGS. 1A-1C, 2A-2B, 3A-3B and 4A-4B is shown in a block diagram. Interface wires 15 from current sensing element 17 provide input to a current measurement circuit 108A, which is an analog circuit that appropriately scales and filters the current channel output of the sensor. The output of current measurement circuit 108A is provided as an input to an analog-to-digital converter (ADC) 106, which converts the current output waveform generated by current measurement circuit 108A to sampled values provided to a central processing unit (CPU) 100 that performs power calculations in accordance with program instruction stored in a memory 104 coupled to CPU 104. Alternatively, current measurement circuit 108A may be omitted and current sensing element 17 may be connected directly to ADC 106. The power usage by the circuit associated with a particular sensor can be determined by assuming that the circuit voltage is constant (e.g., 115 Vrms for electrical branch circuits in the U.S.) and that the phase relationship between the voltage and current is aligned (i.e., in-phase). However, while the assumption of constant voltage is generally sufficient, as properly designed properly distribution systems do not let the line voltage sag more than a small amount, e.g., <3%, the phase relationship between voltage and current is dependent on the power factor of the load, and can vary widely and dynamically by load and over time. Therefore, it is generally desirable to at least know the phase relationship between the branch circuit voltage and current in order to accurately determine power usage by the branch circuit.

Interface wire 15A from the voltage channel of the sensor is provided to a voltage measurement circuit 108B, which is an analog circuit that appropriately scales and filters the voltage channel output of the sensor. A zero-crossing detector 109 may be used to provide phase-only information to a central processing unit 100 that performs power calculations, alternatively or in combination with providing an output of voltage measurement circuit to an input of ADC 106. Alternatively, voltage measurement circuit 108B may be omitted and interface wire 15A connected directly to ADC 106. An input/output (I/O) interface 102 provides either a wireless or wired connection to a local or external monitoring system. When power factor is not taken into account, the instantaneous power used by each branch circuit can be computed as:

$$P_{BRANCH} = V_{rms} * I_{meas}$$

where $V_{rms}$ is a constant value, e.g. 115V, and $I_{meas}$ is a measured rms current value. Power value $P_{BRANCH}$ may be integrated over time to yield the energy use. When the phase of the voltage is known, then the power may be computed more accurately as:

$$P_{BRANCH} = V_{rms} * I_{meas} * \cos(\Phi)$$

where $\Phi$ is a difference in phase angle between the voltage and current waveforms. The output of zero-crossing detector 109 may be compared with the position of the zero crossings in the current waveform generated by current measurement circuit 108A and the time $\Delta T$ between the zero crossings in the current and voltage used to generate phase difference $\Phi$ from the line frequency (assuming the line frequency is 60 Hz):

$$\Phi = 2\pi * 60 * \Delta T$$

In general, the current waveform is not truly sinusoidal and the above approximation may not yield sufficiently accurate results. A more accurate method is to multiply current and voltage samples measured at a sampling rate much higher than the line frequency. The sampled values thus approximate instantaneous values of the current and voltage waveforms and the energy may be computed as:

$$\Sigma(V_n * I_n)$$

A variety of arithmetic methods may be used to determine power, energy and phase relationships from the sampled current and voltage measurements.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A sensor for sensing an electric potential on a wire of a power distribution system and a current passing through the wire, the sensor comprising:
    a housing for detachably coupling the sensor to the wire, wherein the housing comprises two portions mechanically coupled together such that the housing is closed around the wire when the sensor is coupled to the wire;
    a current sensing device integrated in the housing for providing a first output indicative of the current passing through the wire, the current sensing device including at least three ferrite cylinder portions disposed within corresponding ones of the housing portions, wherein when the housing is coupled to the wire, the wire passes through a central void defined by the ferrite cylinder portions extending through a central axis thereof, and wherein a gap is defined along a circumference of a cylinder formed by the ferrite cylinder portions, and wherein the current sensing device further comprises a semiconductor magnetic field sensor disposed within the gap, wherein the gap is located at an circumferential position substantially rotated away from the junctions of the housing portions, whereby the semiconductor magnetic field sensor is configured to be coupled to an external circuit without interfering with the operation of the housing, wherein the first output is an output of the semiconductor magnetic field sensor; and
    a voltage sensing device integrated in the housing for providing a second output indicative of the electric potential on the wire, wherein the voltage sensing device and the current sensing device do not make electrical contact with the wire.

2. The sensor of claim 1, wherein the housing portions are rotatably coupled along an axis parallel to the central axis of the ferrite cylinder portions and disposed at a circumference of the housing, whereby the housing forms a clamshell that is configured to be secured around the wire when the wire is disposed within the central void defined by the ferrite cylinder portions.

3. The sensor of claim 1, wherein the voltage sensing device comprises at least one metal cylinder portion disposed within the housing and axially displaced from the current sensing device along a length of the housing, wherein the second output is a voltage of an electrical connection to the at least one metal cylinder portion.

4. The sensor of claim 1, wherein the voltage sensing device comprises at least one metal cylinder portion disposed within the central void and through which the wire is disposed when the housing is coupled to the wire, wherein the second output is a voltage of an electrical connection to the at least one metal cylinder portion.

5. The sensor of claim 4, wherein the at least one metal cylinder portion is a metal layer deposited on or affixed to at least one of the ferrite cylinder portions.

6. The sensor of claim 1, wherein the voltage sensing device comprises a second wire inserted in parallel with the wire and disposed within the central void, wherein the second output is a voltage of an electrical connection to the second wire.

* * * * *